(12) United States Patent
Kawai

(10) Patent No.: US 6,803,812 B2
(45) Date of Patent: Oct. 12, 2004

(54) ACTIVE FILTER

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 0 days.

(21) Appl. No.: 10/419,470

(22) Filed: Apr. 21, 2003

(65) Prior Publication Data

US 2003/0234682 A1 Dec. 25, 2003

(30) Foreign Application Priority Data

Jun. 24, 2002 (JP) ........................................ 2002-183236

(51) Int. Cl.[7] .............................................. H03K 5/00
(52) U.S. Cl. ........................ 327/552; 327/556; 330/107
(58) Field of Search ................................ 327/552, 553, 327/554, 555, 556, 557, 558, 559; 330/107, 103, 69

(56) References Cited

U.S. PATENT DOCUMENTS

| | | | | |
|---|---|---|---|---|
| 3,805,178 A | * | 4/1974 | Rollett | 330/107 |
| 3,919,658 A | * | 11/1975 | Friend | 330/69 |
| 3,946,328 A | * | 3/1976 | Boctor | 330/107 |
| 4,253,069 A | * | 2/1981 | Nossek | 330/107 |

OTHER PUBLICATIONS

Page 401 of "Analog Filter Design"—original writer: M.E. Vanvalkenburg (1 page—Japanese Language) with English translation thereof attached (translators: Tatehiro Yanagisawa and Gen Kanai).

* cited by examiner

*Primary Examiner*—Dinh T. Le
(74) *Attorney, Agent, or Firm*—Flynn, Thiel, Boutell & Tanis, P.C.

(57) ABSTRACT

A low pass notch filter has a notch frequency close to $\omega_o$. In the notch filter, an output of an operational amplifier is fed back to an inverting input terminal thereof through a second voltage dividing circuit and a charge/discharge resistor. A first voltage dividing circuit is connected between a signal input terminal and a capacitor which is connected to the inverting input terminal. A signal from the output of the operational amplifier to the second voltage dividing circuit is fed back to a divided output point of the first voltage dividing circuit through a capacitor. At the same time, the signal input terminal provides a signal to the non-inverting input terminal of the operational amplifier through a third voltage dividing circuit.

2 Claims, 2 Drawing Sheets

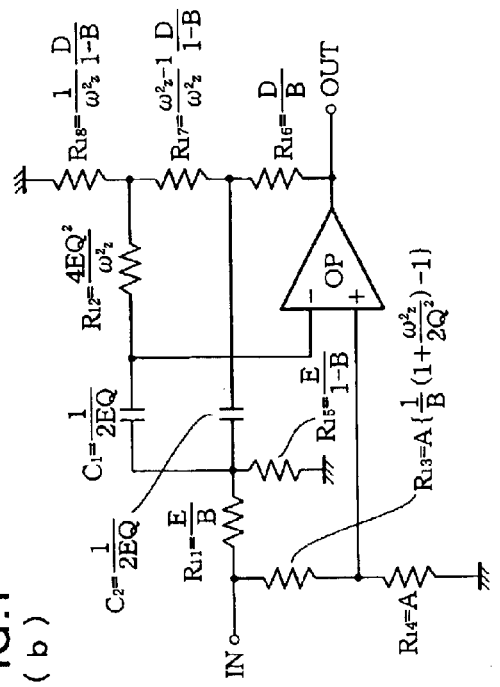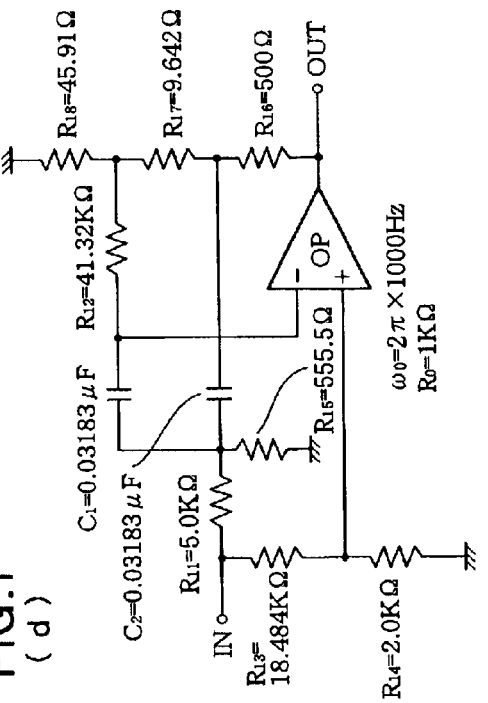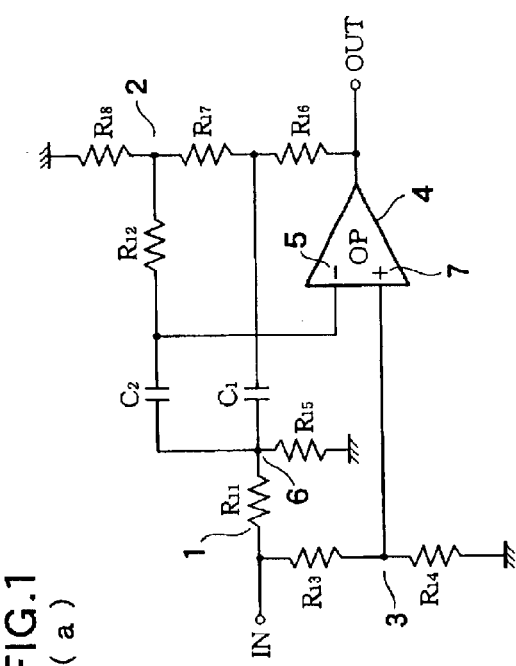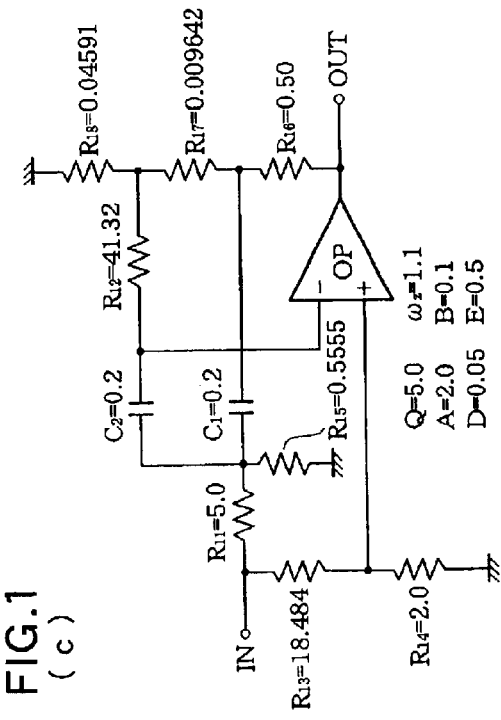
FIG.1(a)
FIG.1(b)
FIG.1(c)
FIG.1(d)

FIG.2 PRIOR ART (a)
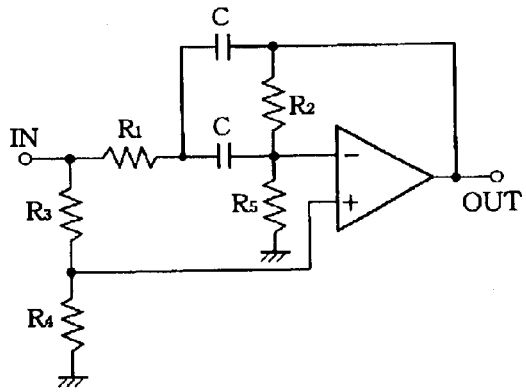
FIG.2 PRIOR ART (b)
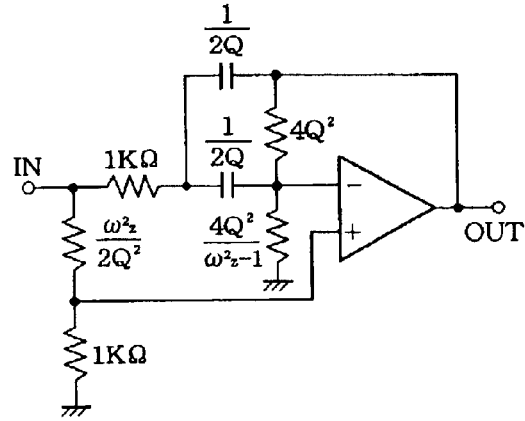
FIG.2 PRIOR ART (c)
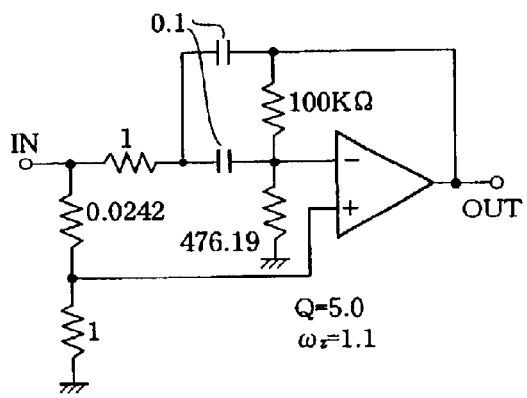
FIG.2 PRIOR ART (d)
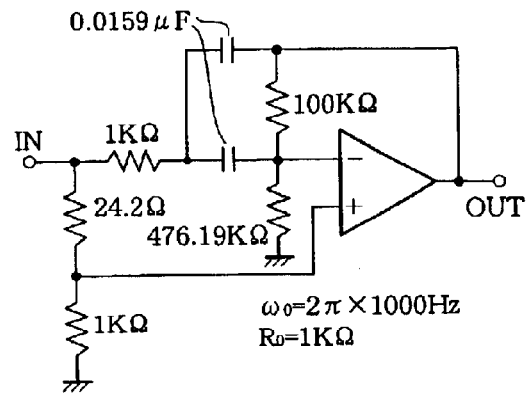
FIG.2 PRIOR ART (e)
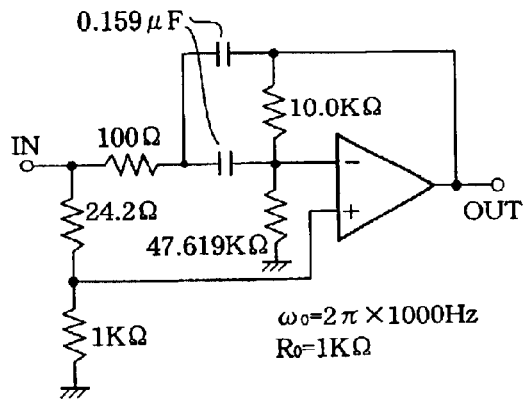

ACTIVE FILTER

BACKGROUND OF THE INVENTION

1. Field of the Invention

The present invention relates to an improvement of circuit construction method of an active filter having a low pass notch filter characteristic.

2. Description of the Related Art

In an active filter there are filters of various types and well used one thereof is a circuit of type so called Delyiannis-Friend. In this circuit there are a band-pass filter, various notch filters, all-pass filter and etc. A low pass notch filter thereof is adopted herein.

Firstly, this filter will be explained and since for example, in page 401 of "ANALOG FILTER DESIGN" (translators: Tatehiro Yanagisawa and Gen Kanai, original writer: M. E. Vanvalkenburg) details thereof is explained, that explanation is done by use of the result.

According to said document, said low pass notch filter has a circuit construction shown in FIG. 2(a) wherein by determining a center angle frequency $\omega_o$, a notch angle frequency $\omega_z$ and a quality factor Q, each of element values can be represented by using these parameters as shown in FIG. 2(b). Here, $R_1$ to $R_5$ are resistors, C is a capacitor, OP is an operational amplifier, IN is a signal input terminal, OUT is a signal output terminal. These element values are normalized with the resistor of 1 Ω, the capacitor of 1 F, the angle frequency $\omega_o$ of 1 and the notch angle frequency $\omega_z$ is normalized with $\omega_o$.

Accordingly, if for example, Q is 5 and $\omega_z$ is 1.1 herein, each of the element values are as shown in FIG. 2(c) and if a resistor scaling factor $R_o$=1KΩ and the angle frequency scaling factor $\omega_o$=2π×1000 Hz, finally, a circuit shown in FIG. 2(d). In this case, it can be understood that a minimum resistor value $R_3$ is 24.2 Ω and a maximum resistor value $R_5$ is 476.19KΩ from this figure and 24.2 Ω of the minimum resistor value can be omitted when range of resistors is considered because this resistor belongs to only a voltage dividing circuit. Thus, a minimum resistor value $R_1$ is 1 kΩ. The maximum resistor value of 476.19KΩ becomes larger as Q becomes larger and $\omega_z$ becomes close to 1. However, when this resistor value becomes higher, an operational amplifier having an input impedance higher than that of said amplifier is required and it results in problems of limit of pass band and etc. to make this impedance higher. So, as shown in FIG. 2(e), it is considered that all resistors are decreased inversely in spite of increasing capacity of the capacitor C but when said resistors are decreased so much, since there is a strong possibility of $\omega_o$ changing depending on variation of an output impedance of a circuit for driving said circuit, this is not desirable. Therefore, if according to the circuit construction of FIG. 2(a) it is wanted to improve the above problem, it has to employ such measure that Q is not increased so much and $\omega_z$ is not made close to 1 so much, or to obtain necessary characteristic the number of circuit steps is increased.

SUMMARY OF THE INVENTION

The object of the present invention is to provide a circuit construction method of an active filter capable of obtaining a desired low pass notch filter even if Q is large and $\omega_z$ is close to 1, which can not be realized by the above described conventional circuit construction, in order to solve the above problem of an active filter, in particular an active filter having a low pass notch filter characteristic.

In order to attain the above object, according to a circuit construction method of an active filter of the present invention, an active filter having a low pass notch filter is constructed by using an operational amplifier, two capacitors and three voltage dividing circuits based on the following idea.

For convenience's sake of explanation, said two capacitors are numbered. That is, a capacitor connected between a signal input circuit and an output circuit of the operational amplifier is $C_1$ and a capacitor connected between the signal input circuit and an inversed input terminal of the operational amplifier is $C_2$. Further, the following counterplanes are employed together.

(1) The circuit is so constructed that a signal to the inversed input terminal of the operational amplifier is seem of a signal due to the voltage dividing circuit from the output of the operational amplifier and a signal charged/discharged through the capacitor $C_2$ from the signal input circuit, but this is changed to such circuit construction that a divided voltage of the voltage dividing circuit is charged/discharged to/from the capacitor $C_2$ through a charge/discharge resistor.

(2) A signal attenuator (a voltage dividing circuit) inserted between connection points of the signal input terminal and the two capacitors.

(3) An attenuation quantity in the voltage dividing circuit between the signal input terminal and a noninversed input terminal of the operational amplifier is increased by an attenuation quantity due to (2).

(4) Since a gain as a filter circuit reduces according to said (2) and (3), dividing loss due to the voltage dividing circuit is increased by that reduction quantity and at the same time feed back quantity from an output of the operational amplifier to the capacitor $C_1$ is decreased by the same quantity in order to recover reduction of circuit gain.

An active filter of the present invention based on the above (1) to (4) comprises first, second and third voltage dividing circuits, an operational amplifier, first and second capacitors, a charge/discharge resistor. An output terminal the operational amplifier is connected to an inversed input terminal of the operational amplifier through the second voltage dividing circuit and the charge/discharge resistor. The first capacitor is connected between the first voltage dividing circuit and the second voltage dividing circuit. The second capacitor is connected between the first voltage dividing circuit and the inversed input terminal of the operational amplifier. The third voltage dividing circuit is connected to the noninversed input terminal of the operational amplifier. The signal input terminal is connected to the first and the third voltage dividing circuit, and the signal output terminal is connected to an output terminal of the operational amplifier.

In the above active filter of the present invention, the following construction may be employed in order to obtain a low pass notch filter characteristic. A driving voltage to the inversed input terminal of the operational amplifier is formed by applying the divided voltage of the second voltage dividing circuit to the second capacitor. A signal from an output terminal of the operational amplifier to the second voltage dividing circuit is attenuated further by attenuation quantity equal to that due to the first voltage dividing circuit and by feeding back this attenuated signal to a divided output point of the first voltage dividing circuit through the first capacitor reduced quantity of the circuit gain due to the first voltage dividing circuit is recovered. At the same time, attenuation quantity of the third voltage dividing circuit is reduced further by equal quantity.

BRIEF DESCRIPTION OF THE DRAWINGS

FIG. 1(a) is a circuit diagram showing an embodiment of the present invention;

FIG. 1(b) is a drawing showing each of normalized element values of each element of the circuit of FIG. 1(a);

FIG. 1(c) is a drawing showing each of element values when Q=5.0, $\omega_z$=1.1, A=2.0, B=0.1, D=0.05, E=0.5 in FIG. 1(b);

FIG. 1(d) is a drawing showing each of element values when a resistance scaling coefficient $R_o$=1KΩ, an angle frequency scaling coefficient $\omega_o$=2π×1000 Hz;

FIG. 2(a) is a circuit diagram of a conventional low pass notch filter;

FIG. 2(b) is a drawing showing each of normalized element values of each element of the circuit of FIG. 2(a);

FIG. 2(c) is a drawing showing each of element values when Q=0.5, $\omega_z$=1.1 in FIG. 2(b);

FIG. 2(d) is a drawing showing each of element values when a resistance scaling coefficient $R_o$=1KΩ, an angle frequency scaling coefficient $\omega_o$=2π×1000 Hz; and FIG. 2(e) is a diagram showing each of element values when resistance values relating to a frequency characteristic in FIG. 2(d) are made 1/10 times and capacitance values of capacitors are made 10 times therein.

DESCRIPTION OF THE PREFERRED EMBODIMENTS

FIG. 1(a) shows an embodiment of an active filter of the present invention having low pass notch filter characteristics. In the same figure, $R_{11}$ to $R_{18}$ are resistors, $C_1$ and $C_2$ are capacitors, OP is an operational amplifier, IN is a signal input terminal, OUT is a signal output terminal, 1 is a first voltage dividing circuit, 2 is a second voltage dividing circuit and 3 is a third voltage dividing circuit.

In the active filter of FIG. 1(a), the second voltage dividing circuit consisting of the resistors $R_{16}$, $R_{17}$ and $R_{18}$ and the charge/discharge resistors as a feed back path from an output terminal 4 of the operational amplifier OP to an inverting input terminal of the operational amplifier OP is provided. Also, a divided voltage of the second voltage dividing circuit 2 is applied to the second capacitor $C_2$ provided between the inverting input terminal 5 of the operational amplifier OP and a divided output point 6 of the first voltage dividing circuit 1 consisting of the resistors $R_{11}$ and $R_{15}$ through a charge/discharge resistor $R_{12}$ to form a driving voltage to the inverting input terminal 5 of the operational amplifier OP.

Further, the first voltage dividing circuit 1 is provided between the signal input terminal IN and the second capacitor $C_2$ and a feed back signal from an output of the operational amplifier OP to the second voltage dividing circuit 2 is reduced further by attenuation quantity equal to attenuation quantity due to this. This reduced feed back signal is fed back to the divided output point 6 of the first voltage dividing circuit 1 through the first capacitor $C_1$. By this attenuation quantity of circuit gain due to the first voltage dividing circuit 1 is recovered. At the same time, attenuation quantity of the third voltage dividing circuit provided between the signal input terminal IN and the noninversed input terminal 7 of the operational amplifier OP is attenuated further by equal quantity.

FIG. 1(b) shows each of element values indicated by normalized references of each of elements in the circuit of FIG. 1(a) and A, B, C and E are coefficients described below.

Each of element values can be obtained by means of $\omega_o$, $\omega_z$, Q and the coefficients A to E as follows.

Firstly, $R_{12}$ can be obtained from a parallel value of $R_2=4Q^2$ and $R_5=4Q^2/(\omega_z^2-1)$ in FIG. 2(b) as $4Q^2/\omega_z^2$. Since voltage division is done by $R_2$ and $R_5$, and $R_2:R_5=4Q^2:4Q^2(\omega_z^2-1)$, if this divided voltage is 1, $R_{17}$ is $(\omega_z^2-1)/\omega_z^2$ and $R_{18}$ is $1/\omega_z^2$.

Nextly, in order to make the resistance value of $R_{12}$ smaller it is made to be $4EQ^2/\omega_z^2$ by multiplying it by E but at this time it is necessary to keep Q and $\omega_o$ so as not to change. For this reason the value of $C_1$, $C_2$ is determined to be ½EQ by dividing it with E and the input resistor may be obtained by multiplying 1 of $R_1$ by E but this resistance value can not be made small so much in view of an output resistor of an forward stage of this filter circuit. So, if a L type attenuator (a voltage dividing type) is constructed by $R_{11}$ and $R_{15}$ of the first voltage dividing circuit 1, B is a decreasing coefficient and E is an output resistor of this attenuator, $R_{11}$ may be E/B and $R_{16}$ may be E/(1-B) as shown in FIG. 1(b). Since a circuit gain decreases by B time by this operation, if a gain of the operational amplifier is increased by 1/B, an original circuit gain can be recovered. For this purpose a feed back quantity from an output circuit of the operational amplifier may be attenuated by the same quantity as that of an input circuit side thereof by further adding an attenuation resistor thereto. That is, said attenuation resistor is $R_{16}$ and may be multiplied by 1/B, and $R_{17}$ and $R_{18}$ may be multiplied by 1/(1/B). D shown in FIG. 1(b) is a coefficient for further changing resistor values of $R_{16}$, $R_{17}$ and $R_{18}$ determined above. Since it is necessary that there is relation of $R_{12}>>R_{18}$ between $R_{12}$ and $R_{18}$ determined above, D should be made as small as possible.

In the inverting input terminal side 5 of the operational amplifier, a signal is reduced by coefficient B time by the attenuator of $R_{11}$ and $R_{15}$. In the non-inverting terminal side 7 it is necessary to reduce the signal by equal quantity. Since an original attenuation quantity is $1/\{1+(\omega_z^2/2Q^2)\}$ from FIG. 2(b), this may be changed to $1/B\{1+(\omega_z^2/2Q^2)\}$ and by only changing $R_{13}$ it may be $(1/B)\{1+(\omega_z^2/2Q^2)-1\}$. A in FIG. 1(b) is a coefficient for further changing $R_{13}$, $R_{14}$ as determined above.

Each of element values is determined by said coefficients as described above and if Q=5.0, $\omega_z$=1.1, A=2.0, B=0.1, D=0.05, E=0.5, the values as shown in FIG. 1(c) are obtained. So, as shown in FIG. 2(d), if a resistance scaling coefficient $R_o$=1KΩ, an angle frequency scaling coefficient $\omega_o$=2π×1000 Hz, the value as shown in FIG. 1(d) are obtained.

As is apparent from comparison FIG. 2(d) with FIG. 1(d), the number of resistors increases a little but the resistor connected to the input terminal of the operational amplifier is not the high resistance value as shown in FIG. 2. Also, in the second voltage dividing circuit connected to an output side the value of $R_{17}$ is small comparatively but since this has no relation to an output circuit apparently, there is no such basic problem that $\omega_o$ is influenced in accordance with relative relation of an impedance of a driving circuit connected to an input side as shown in FIG. 2.

As explained in detail above, in a low pass notch filter of a conventional Delyiannis-Friend type, high resistors and low resistors must be used the larger Q is and the closer $\omega_z$ is to 1 and thus it becomes difficult to realize the filter because of selection of an usable operational amplifier and requirement to an output impedance of a driving circuit connected to an input side.

However, according to the present invention, since such designs as to avoid use of a high resistor and influence of an output impedance of a driving circuit are possible, such a circuit that high band characteristic is not limited even if Q is considerably large and $\omega_z$ is close to 1 and filter characteristic is not influenced even if an impedance of an input side driving circuit is high comparatively can be realized.

What is claimed is:

1. An active filter comprising a first voltage dividing circuit, a second voltage dividing circuit, a third voltage dividing circuit, a first capacitor, a second capacitor, a charge/discharge resistor and an operational amplifier, an output terminal of the operational amplifier being connected to an inverting input terminal thereof through the second voltage dividing circuit and the charge/discharge resistor, the first capacitor being connected between the first voltage dividing circuit and the second voltage dividing circuit, the second capacitor being connected between the first voltage dividing circuit and the inverting input terminal of the operational amplifier, the third voltage dividing circuit being connected to a non-inverting input terminal of the operational amplifier, a signal input terminal being connected to the first and the third voltage dividing circuits, and the output terminal of the operational amplifier comprising a signal output terminal of the filter.

2. The active filter according to claim 1, wherein a driving voltage to the inverting input terminal of the operational amplifier is provided by applying a divided voltage of the second voltage dividing circuit to the second capacitor through the charge/discharge resistor, a signal from the output terminal of the operational amplifier to the second voltage dividing circuit being attenuated further by an attenuation quantity equal to an attenuation quantity due to the first voltage dividing circuit, a reduction quantity of a circuit gain due to the first voltage dividing circuit being recovered by feeding back the attenuated signal to a divided output point of the first voltage dividing circuit through the first capacitor, and an attenuation quantity of the third voltage dividing circuit being attenuated further by an equal quantity, thereby to obtain a low pass notch filter characteristic.

* * * * *